United States Patent
Gupta et al.

(10) Patent No.: US 11,849,581 B2
(45) Date of Patent: Dec. 19, 2023

(54) ELECTRONIC DEVICES WITH RECESSED CONDUCTIVE STRUCTURES

(71) Applicant: Micron Technology, Inc., Boise, ID (US)

(72) Inventors: Sidhartha Gupta, Boise, ID (US); Anilkumar Chandolu, Boise, ID (US); S M Istiaque Hossain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 17/064,092

(22) Filed: Oct. 6, 2020

(65) Prior Publication Data
US 2022/0109002 A1  Apr. 7, 2022

(51) Int. Cl.
H01L 21/768 (2006.01)
H10B 43/27 (2023.01)
G11C 11/56 (2006.01)

(52) U.S. Cl.
CPC .......... *H10B 43/27* (2023.02); *G11C 11/5671* (2013.01); *H01L 21/76879* (2013.01); *H01L 21/76897* (2013.01)

(58) Field of Classification Search
CPC ......... H01L 27/11582; H01L 27/11556; H01L 27/1157; H01L 27/11565; H01L 27/11573; H10B 43/27; H10B 41/27; H10B 43/10; H10B 43/50; H10B 43/40
See application file for complete search history.

(56) References Cited

U.S. PATENT DOCUMENTS

| | | |
|---|---|---|
| 9,070,581 B2 | 6/2015 | Son et al. |
| 9,449,982 B2 | 9/2016 | Lu et al. |
| 10,373,973 B2 | 8/2019 | Choi et al. |
| 10,580,795 B1 | 3/2020 | Uo et al. |
| 2014/0349477 A1 | 11/2014 | Chandrashekar et al. |
| 2015/0348984 A1 | 12/2015 | Yada et al. |
| 2016/0204117 A1 | 7/2016 | Liu et al. |

(Continued)

FOREIGN PATENT DOCUMENTS

| | | |
|---|---|---|
| WO | 2015/038687 A1 | 3/2015 |
| WO | 2020/081147 A1 | 4/2020 |

OTHER PUBLICATIONS

Shuangquang et al. ("methods of forming microelectronic devices . . . ") (Year: 2019).*

(Continued)

*Primary Examiner* — Tony Tran
(74) *Attorney, Agent, or Firm* — TraskBritt

(57) ABSTRACT

An electronic device comprises a stack structure comprising vertically alternating insulative structures and conductive structures arranged in tiers, pillars extending vertically through the stack structure, and a barrier material overlying the stack structure. The electronic device comprises a first insulative material extending through the barrier material and into an upper tier portion of the stack structure, and a second insulative material laterally adjacent to the first insulative material and laterally adjacent to at least some of the conductive structures in the upper tier portion of the stack structure. At least a portion of the second insulative material is in vertical alignment with the barrier material. Additional electronic devices and related methods and systems are also disclosed.

16 Claims, 7 Drawing Sheets

(56) References Cited

U.S. PATENT DOCUMENTS

2017/0062286 A1    3/2017  Ito et al.
2019/0319045 A1   10/2019  Choi et al.
2020/0119038 A1    4/2020  Hopkins et al.
2022/0108998 A1*   4/2022  Chandolu ......... H01L 27/11519

OTHER PUBLICATIONS

Yi Hu et al. ("Microelectronic Devices Including Contact Structures . . . ") (Year: 2020).*
Chandolu et al., Microelectronic Devices with Lower Recessed Conductive Structures and Related Methods and Systems, U.S. Appl. No. 16/922,792, filed Jul. 7, 2020.
Hu et al., Microelectronic Devices Including Contact Structures, and Related Electronic Systems and Methods, U.S. Appl. No. 16/877,233, filed May 18, 2020.
Luo et al., Methods of Forming Microelectronic Devices, and Related Microelectronic Devices, Memory Devices, and Electronic Systems, U.S. Appl. No. 16/667,719, filed Oct. 29, 2019.

* cited by examiner

ELECTRONIC DEVICES WITH RECESSED CONDUCTIVE STRUCTURES

TECHNICAL FIELD

Embodiments disclosed herein relate to electronic devices and electronic device fabrication. More particularly, embodiments of the disclosure relate to electronic devices with recessed conductive structures and insulative extensions adjacent to the recessed conductive structures, and to related methods and systems.

BACKGROUND

Memory devices provide data storage for electronic systems. A Flash memory device is one of various memory device types and has numerous uses in modern computers and other electrical devices. A conventional Flash memory device includes a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional NAND (3D NAND) memory device, a type of vertical memory device, not only are the memory cells arranged in row and column fashion in a horizontal array, but tiers of the horizontal arrays are stacked (e.g., vertically stacked) over one another to provide a three-dimensional array of the memory cells. The tiers include alternating conductive materials with insulating (e.g., dielectric) materials. The conductive materials function as control gates for, e.g., access lines (e.g., word lines) of the memory cells.

As memory density increases, the 3D NAND memory device may include one or more decks (e.g., stack structures) including the tiers of the alternating conductive materials and dielectric materials. Vertical structures (e.g., memory pillars including channel regions) extend along the vertical string of the memory cells. Each vertical memory string may include at least one select device coupled in series to a serial combination of vertically-stacked memory cells. A drain end of a string is adjacent one of the top and bottom of the vertical structure (e.g., memory pillar), while a source end of the string is adjacent to the other of the top and bottom of the pillar. The drain end is operably connected to a bit line, while the source end is operably connected to a source. String drivers drive the access line (e.g., word line) voltages to write to or read from the memory cells of the vertical string. The 3D NAND memory devices also include other conductive materials configured to provide electrical connection between the word lines and other conductive structures of the device so that the memory cells of the memory pillars can be selected for writing, reading, and erasing operations.

To form the memory pillars, the tiers of the decks are patterned to form pillar openings, cell films and fill materials are formed in the pillar openings, and contact plugs are formed over the cell films and fill materials, producing memory pillars extending through the one or more decks. The cell films include a channel material and cell materials. As the number of tiers of the conductive structures increases, processing conditions of the formation of aligned contacts to various components of the 3D NAND memory device becomes increasingly difficult. In addition, other technologies to increase memory density have reduced the spacing between adjacent vertical memory strings. However, reducing the spacing between adjacent vertical memory strings may increase a difficulty of forming individual electrical connections to the vertical memory strings without shorting to adjacent vertical memory strings.

DETAILED DESCRIPTION

Figure 1A:
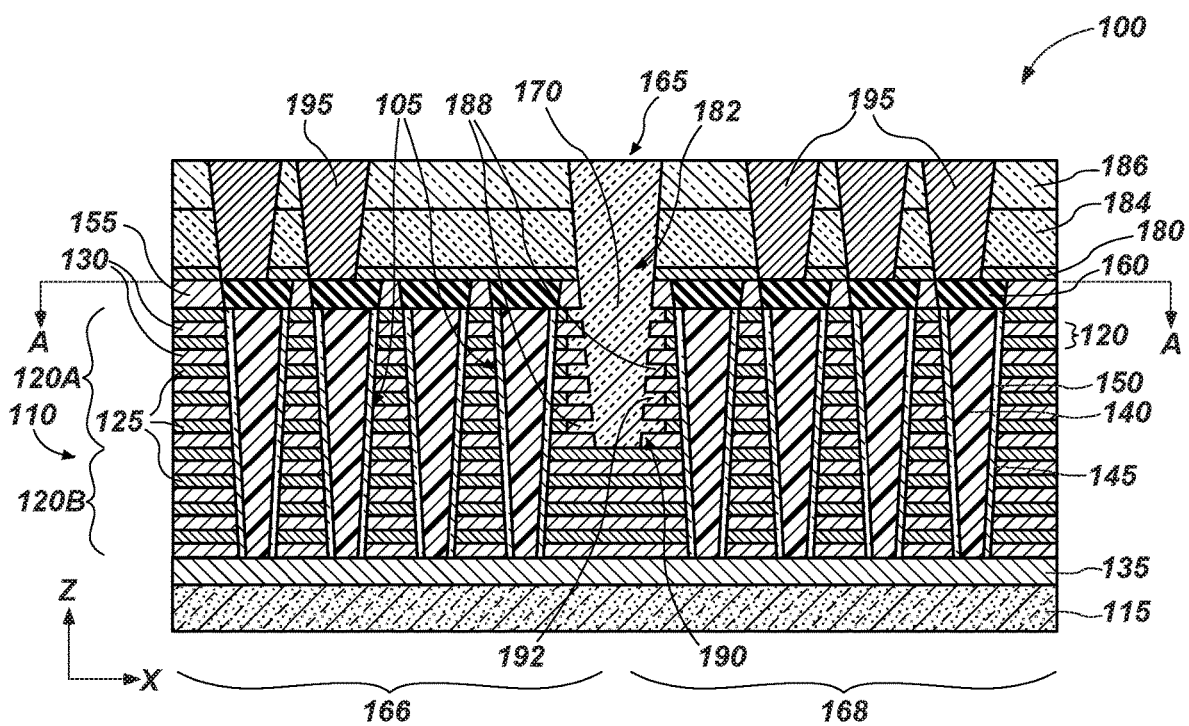
FIG. 1A is a cross-sectional view of an electronic device including pillars arranged in subblocks of a stack structure according to embodiments of the disclosure.

An electronic device (e.g., an apparatus, a microelectronic device, a semiconductor device, a memory device) that includes pillars arranged in subblocks of a stack structure is disclosed, with upper conductive structures that function as upper select gate(s) (e.g., drain side select gate(s) (SGDs)) of the electronic device being recessed (e.g., laterally recessed) relative to vertically neighboring insulative structures of the stack structure. A barrier material is formed over the stack structure. An insulative material is formed in openings (e.g., slits) of the stack structure and is configured as a continuous material extending between adjacent pillars in a central region of the stack structure. The insulative material functions to electrically isolate one subblock (e.g., memory subblock) of the stack structure from another (e.g., an adjacent) subblock of the stack structure of the electronic device. Insulative extensions (e.g., additional regions of insulative material) are formed in recessed regions of the upper conductive structures. By forming the insulative extensions vertically adjacent to the insulative material and laterally adjacent to the upper conductive structures, the electronic device according to embodiments of the disclosure exhibits reduced occurrences of bridging (e.g., electrical connection) between two or more portions of the conductive structures, compared to conventional electronic devices, in the event that a portion of contact structures (e.g., contacts, pillar contacts) extends below the barrier material. The insulative extensions may facilitate a reduction in etch profile requirements for the upper select gate (e.g., SGD) isolation provided by the insulative material, unlike with conventional electronic devices in which the SGD isolation is provided solely by the insulative material with the openings and that lacks the insulative extensions.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing the electronic device (e.g., microelectronic device, semiconductor device, memory device), or the structures thereof (e.g., systems). The remainder of the process flow is known to those of ordinary skill in the art. Accordingly, only the methods and structures necessary to understand embodiments of the present electronic device and methods are described herein.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms of the terms "a," "an," and "the" are intended to include the plural forms as well, unless the context clearly indicates otherwise.

As used herein, the term "and/or" includes any and all combinations of one or more of the associated listed items.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. The height of a respective material or feature (e.g., structure) may be defined as a dimension in a vertical plane.

As used herein, the term "width" means and includes a dimension, along a horizontal plane (e.g., at a certain elevation, if identified), defining a maximum distance, along such plane, of the particular material or structure. For example, a "width" of a structure, that is at least partially hollow, is the horizontal dimension between outermost edges or sidewalls of the structure, such as an outer diameter for a hollow, cylindrical structure.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (i.e., neighboring) features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the phrase "coupled to" refers to structures operatively connected with each other, such as electrically connected through a direct ohmic connection or through an indirect connection (e.g., via another structure).

As used herein, the term "selectively removable" means and includes a material that exhibits a greater removal rate responsive to process conditions, such as exposure to radiation (e.g., heat), relative to another material exposed to the same process conditions. A material that is selectively removable relative to another material is substantially completely removable without removing substantially any of the another material.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily a void. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "sacrificial," when used in reference to a material or structure, means and includes a material, structure, or a portion of a material or structure that is formed during a fabrication process but which is removed (e.g., substantially removed) prior to completion of the fabrication process.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device includes of tiers of alternating conductive materials and dielectric materials.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). In addition, an "insulative structure" means and includes a structure formed of and including an insulative material.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material, a base structure) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Figure 1B:
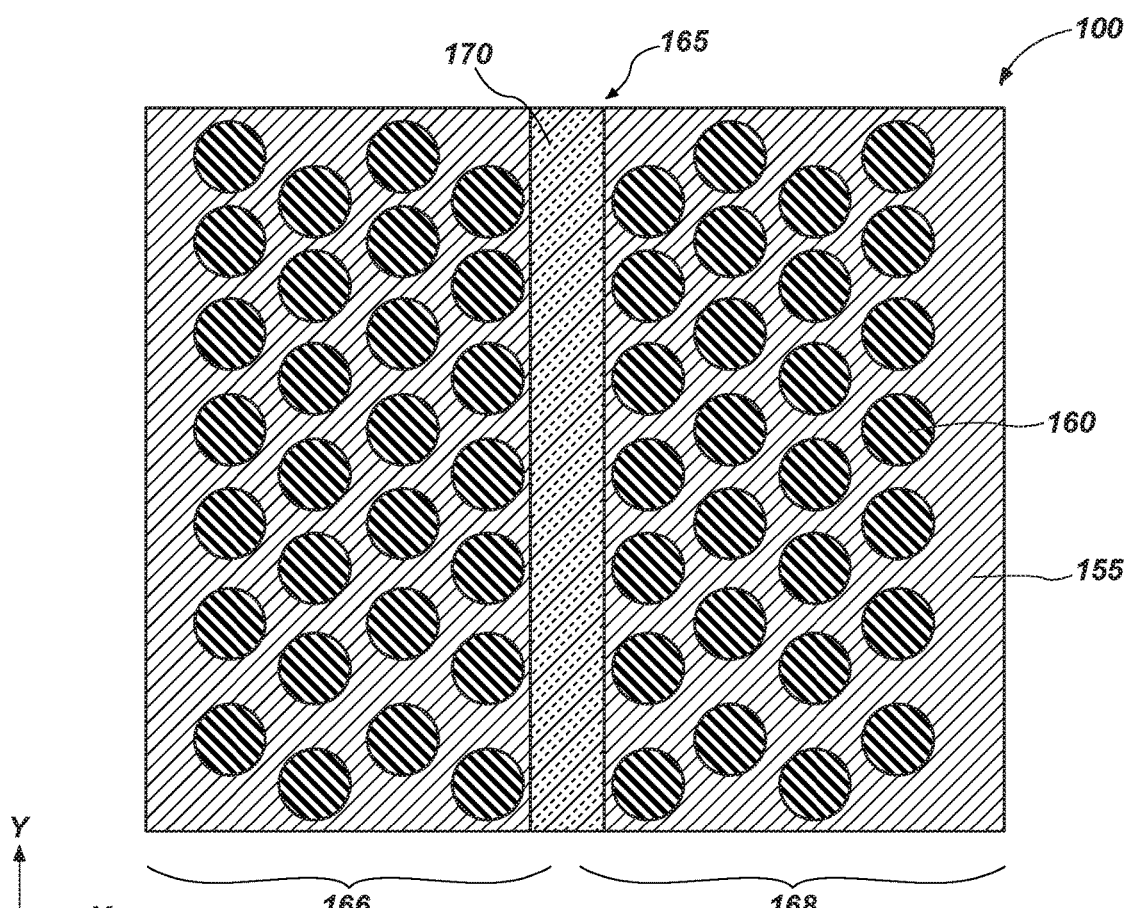
FIG. 1B is a top down view of the electronic device of FIG. 1A taken along the A-A line.

An electronic device 100 including pillars 105 in stack structure 110 adjacent to (e.g., vertically adjacent to, on) a base structure 115 (e.g., a substrate) is shown in FIGS. 1A and 1B, where FIG. 1B is a top down view taken along the A-A line of FIG. 1. The electronic device 100 also includes tiers 120, conductive structures 125, insulative structures 130, source structure 135, fill material 140, pillar openings 145, cell films 150, upper insulative structure 155, contact plugs 160, and at least one opening 165 (e.g., at least one slit). The opening 165 may divide the stack structure 110 of the electronic device 100 into separate subblocks, such as a first subblock 166 and a second subblock 168, although additional subblocks (e.g., four subblocks) may be contemplated. As shown in FIGS. 1A and 1B, the first subblock 166 and the second subblock 168 may each include a plurality (e.g., multiple, more than one) of the pillars 105. The pillars 105 may be formed in the pillar openings 145 vertically extending at least partially through the tiers 120. The pillars 105 may be configured as memory pillars (e.g., channel pillars) which are operably coupled (e.g., electrically connected) to the source structure 135. For example, the pillar openings 145 are shown in FIG. 1A containing the cell films 150 and the fill material 140. At least some of the pillars 105 may be configured as so-called "dummy pillars" that are not operably coupled (e.g., electrically connected) with the source structure 135. For example, such dummy pillars may provide mechanical integrity and support to memory pillars within the stack structure 110.

The electronic device 100 also includes a first insulative material 170 located within the opening 165, a barrier material 180 adjacent to (e.g., vertically adjacent to, on) upper surfaces of the upper insulative structure 155 and the contact plugs 160, a second insulative material 184 adjacent to (e.g., vertically adjacent to, on) the barrier material 180, and a third insulative material 186 adjacent to (e.g., vertically adjacent to, on) the second insulative material 184. Contact structures 195 (e.g., contacts, pillar contacts) are located in openings extending vertically through each of the third insulative material 186, the second insulative material 184, and the barrier material 180. In some embodiments, the contact structures 195 may be adjacent to (e.g., vertically adjacent to, on) and in direct electrical contact with the contact plugs 160. In other embodiments, additional contact structures (e.g., contact vias) may be located between the contact structures 195 and the contact plugs 160. In some such embodiments, an additional portion of the barrier material 180 may be adjacent to (e.g., vertically adjacent to, on) the additional contact structures with at least some of the conductive structures 125 located vertically between two portions of the barrier material 180. The barrier material 180 may be separated into two portions by an opening 182, which corresponds to the opening 165 of the stack structure 110. The barrier material 180 may, therefore, be discontinuous in the horizontal direction of FIG. 1A, with the first insulative material 170 separating the portions of the barrier material 180.

The electronic device 100 further includes a fourth insulative material 188 located within recessed regions 190 adjacent to (e.g., laterally adjacent to) the first insulative material 170 in the opening 165 of the stack structure 110. The fourth insulative material 188 is adjacent to (e.g., laterally adjacent to) at least some of the conductive structures 125 within individual tiers 120 of the stack structure 110. The fourth insulative material 188 extends laterally outward, away from the first insulative material 170 in the opening 165, forming insulative extensions 192 within the recessed regions 190. For example, the insulative extensions 192 may be located adjacent to at least some of the conductive structures 125 within an upper tier portion 120A of the tiers 120 while a lower tier portion 120B of the tiers 120 below (e.g., vertically adjacent to) a lower surface of the opening 165 may not include (e.g., lacks) the insulative extensions 192 adjacent to the conductive structures 125. The insulative extensions 192 vertically alternate with ends of the insulative structures 130 within the upper tier portion 120A. Accordingly, portions of the conductive structures 125 proximal to the first insulative material 170 and within the upper tier portion 120A (e.g., the portions of the conductive structures 125 laterally adjacent to the insulative extensions 192) are a shorter width (e.g., a width that is relatively less) than a width of at least some portions of the conductive structures 125 in the lower tier portion 120B.

The tiers 120 of the stack structure 110 of the electronic device 100 may each individually include at least one of the conductive structures 125 vertically neighboring at least one of the insulative structures 130. The stack structure 110 may include a desired number of the tiers 120. For example, the stack structure 110 may include greater than or equal to eight (8) tiers 120, greater than or equal to sixteen (16) tiers 120, greater than or equal to thirty-two (32) tiers 120, greater than or equal to sixty-four (64) tiers 120, greater than or equal to one hundred and twenty-eight (128) tiers 120, or greater than or equal to two hundred and fifty-six (256) tiers 120 of the conductive structures 125 and the insulative structures 130.

The conductive structures 125 of the electronic device 100 may be formed of and include at least one conductive material. In some embodiments, the conductive structures 125 are formed of tungsten (W). The conductive structures 125 may be operatively coupled to electrically conductive structures, such as to the contact plugs 160 and the source structure 135. The conductive structures 125 may also provide electrical access to other electrically conductive components of the electronic device 100, which may include, but are not limited to, data lines (e.g., bit lines, select lines), contacts, interconnects, routing structures, CMOS circuitry, or other electrically conductive components vertically above or vertically below the stack structure 110. By way of example only, the conductive structures 125 may electrically connect the source structure 135 to other electrically conductive components of the electronic device 100. The conductive structures 125 of the tiers 120 may, for example, be configured as access lines (e.g., word lines, gates) of the electronic device 100 that are formed in place of sacrificial materials (e.g., nitride materials) by a so-called "replacement gate" process. The electronic device 100 may alternatively be formed by a so-called "gate first" process in which the tiers 120 having alternating conductive structures 125 and insulative structures 130 are formed prior to forming the pillars 105. For instance, the tiers 120 having alternating conductive structures 125 and insulative structures 130 are present in the electronic device 100 prior to formation of the pillars 105, and the pillars 105, the contact plugs 160, the opening 165, the first insulative material 170, and the fourth insulative material 188 of the insulative extensions 192 are subsequently formed following the gate first process.

The insulative structures 130, including the upper insulative structure 155, may be formed of and include at least one dielectric material. In some embodiments, the insulative structures 130 are formed of and include $SiO_2$. The insulative structures 130 may, for example, be configured to electrically isolate the conductive structures 125 of the electronic device 100 from one another and from other conductive components (e.g., additional components vertically above or vertically below the stack structure 110) of the electronic device 100. The insulative structures 130 of the tiers 120 are positioned between the conductive structures 125 of the tiers 120.

At least one lower conductive structure 125 of the stack structure 110 may function as at least one lower select gate (e.g., at least one source side select gate (SGS)) of the electronic device 100. In some embodiments, a single (e.g., only one) conductive structure 125 of a vertically lowermost tier 120 of the stack structure 110 functions as a lower select gate (e.g., a SGS) of the electronic device 100. In some embodiments, upper conductive structure(s) 125 of the stack structure 110 may function as upper select gate(s) (e.g., drain side select gate(s) (SGDs)) of the electronic device 100. In some embodiments, horizontally neighboring (e.g., in the Y-direction) conductive structures 125 of a vertically uppermost tier 120 of the stack structure 110 may function as upper select gates (e.g., SGDs) of the electronic device 100. In other embodiments, the stack structure 110 includes a lower portion including the conductive structures 125 laterally adjacent to the pillars 105 and an upper portion including the conductive structures 125 laterally adjacent to the additional contact structures located between the contact structures 195 and the contact plugs 160 and separated from the lower portion of the stack structure 110 by the barrier material 180. The conductive structures 125 within the upper portion may function as SGDs (e.g., de-integrated SGDs).

In some embodiments, the upper tier portion 120A includes the uppermost tiers 120, such as from about 0.1% to about 3% of the total quantity (e.g., total number) of the tiers 120 of the stack structure 110. For example, the upper tier portion 120A may include from an uppermost two of the tiers 120 to an uppermost nine of the tiers 120. The particular quantity (e.g., number) of the tiers 120 included in the upper tier portion 120A may be selected or otherwise tailored to be such quantity that is most prone to electrical contact (e.g., bridging) with a portion of the contact structures 195 in the absence of the insulative extensions 192. For example, the quantity of the tiers 120 in the upper tier portion 120A may include the number of conductive structures 125 (e.g., word lines) that function as the upper select gates of the electronic device 100. Further, a depth (e.g., vertical extent) of the opening 165 (e.g., SGD isolation) may be selected to correspond with the number of conductive structures 125 that function as the upper select gates.

As illustrated in FIG. 1A, the electronic device 100 includes a single deck. However, the disclosure is not so limited. For example, the electronic device 100 may include more than one deck (e.g., two decks) including a lower deck and an upper deck, with each deck including the tiers 120 of alternating conductive structures 125 and insulative structures 130. In such embodiments, the lower deck and the upper deck are vertically adjacent to one another. In additional embodiments, the electronic device 100 may include a greater number of decks within the stack structure 110. In some such embodiments, upper select gates of the electronic device 100 may be located vertically above the stack structure 110 (e.g., within an additional stack structure (not shown) of a multi-stack device) overlying the stack structure 110. While the stack structure 110 of the electronic device 100 of FIG. 1A includes five tiers 120 within the upper tier portion 120A and four tiers 120 within the lower tier portion 120B, more tiers 120 or less tiers 120 may be present within each of the upper tier portion 120A and the lower tier portion 120B. While not illustrated in FIG. 1A, complementary metal-oxide-semiconductor (CMOS) circuitry may, for example, be present below the base structure 115, as described in greater detail with reference to FIG. 2.

The pillars 105 extend from an upper surface of the contact plugs 160 to an upper surface of the source structure 135, which is present adjacent to the base structure 115. The pillars 105 may, optionally, extend at least partially into the source structure 135, or may extend through the source structure 135 and into the base structure 115. While FIGS. 1A and 1B illustrate eight contact plugs 160 and eight pillars 105, additional contact plugs 160 and pillars 105 may be present depending on the desired configuration of the electronic device 100.

The pillars 105 include a channel material and cell materials (shown collectively in FIG. 1A as the cell film 150) on sidewalls of the tiers 120 and the fill material 140 between opposite portions of the cell film 150. The fill material 140 and the cell film 150 of the pillars 105 extend through the stack structure 110 from an upper surface to a lower surface of the stack structure 110. The channel material may include polysilicon or other channel material as known in the art. In some embodiments, the channel material is polysilicon. The cell materials may include one or more of a dielectric material, a conductive material, etc. The cell material(s) may include one or more of an oxide material, a storage material, or a tunnel dielectric material as known in the art. By way of example only, the cell materials may include an oxide-nitride-oxide (ONO) structure having a tunnel dielectric material, a charge trapping material, and a charge blocking material between the channel material and the insulative structures 130 or between the channel material and the conductive structures 125. The charge trapping material may be located directly between the tunnel dielectric material and the charge blocking material. In some embodiments, the tunnel dielectric material directly contacts the channel material and the charge trapping material. The charge blocking material may directly contact and may be located directly adjacent to the charge trapping material and the insulative structures 130 or the conductive structures 125.

The fill material 140 may be a dielectric material. In some embodiments, the fill material 140 is an oxide material. The fill material 140 may substantially completely fill the pillar openings 145 in which the pillars 105 are formed. An upper surface of the fill material 140 may be substantially coplanar with an upper surface of the cell film 150. The fill material 140 separates opposing portions of the cell film 150 in the pillar openings 145.

The pillars 105 also include the contact plugs 160, which are positioned over the fill material 140 and the cell film 150 of the pillars 105. The contact plug 160 is formed of (e.g., includes) a conductive material. In some embodiments, the contact plug 160 is formed of polysilicon.

The pillars 105 and contact plugs 160 are formed on pitch (e.g., exhibit the same pitch). An upper surface of the contact plug 160 may be substantially coplanar with an upper surface of the upper insulative structure 155 of the uppermost tier 120. The contact plug 160 may be operably coupled (e.g., electrically connected) to the contact structures 195. The contact structures 195 may, in turn be operably coupled (e.g., electrically connected) to other conductive materials of the electronic device 100, such as being electrically connected to additional contacts and/or conductive lines (not shown) above the stack structure 110. Individual pillars 105, along with corresponding individual contact plugs 160, are associated with a single (e.g., one) of the contact structures 195. For clarity and ease of understanding the drawings and associated description, additional contact structures 195 surrounding the opening 165, are absent in FIG. 1A.

The contact structures 195 may be formed of and include at least one conductive material. By way of non-limiting example, the contact structures 195 may be formed of and include n-doped polysilicon, p-doped polysilicon, undoped polysilicon, or a metal. In some embodiments, the contact structures 195 include n-doped polysilicon. In other embodiments, the contact structures 195 include tungsten (W). Outer side surfaces (e.g., sidewalls) of the contact structures 195 may exhibit a tapered profile with an upper portion of individual contact structures 195 having a greater critical dimension (e.g., width) than a lower portion thereof, as shown in FIG. 1A. In other embodiments, the contact structures 195 have a different profile, for example, a substantially orthogonal (e.g., substantially rectangular) profile, a dish-shaped profile, or any other three-dimensional recess shape, such that at least portions (e.g., a lateral extent of upper surfaces) of the contact structures 195 extend beyond sidewalls of the pillars 105 in at least one lateral direction (e.g., the X-direction). As shown in FIG. 1A, the contact structures 195 may be laterally offset (e.g., positioned off-center or staggered) in order to facilitate electrical connection with the contact plugs 160 of the pillars 105.

The contact structures 195 are located in openings extending vertically through each of the third insulative material 186, the second insulative material 184, and the barrier material 180. The second insulative material 184 and the third insulative material 186 may be individually formed of and include at least one dielectric material. In some embodiments, one or more of the second insulative material 184 and the third insulative material 186 are formed of and include $SiO_2$. A material composition of the third insulative material 186 may be substantially the same as or different than a material composition of the second insulative material 184, and a material composition of at least one of the second insulative material 184 and the third insulative material 186 may be substantially the same as or different than a material composition of the insulative structures 130 of the tiers 120 of the stack structure 110.

The upper insulative structure 155 of the stack structure 110 and the second insulative material 184 are separated from one another by the barrier material 180. The barrier material 180 may be formed of and include at least one dielectric material. For example, the barrier material 180 may comprise a nitride material (e.g., a silicon nitride material, an oxynitride material), such as an etch stop material located over upper surfaces of upper insulative structure 155 and the contact plugs 160. The barrier material 180 may be characterized as a so-called "nitride stop-etch" material, which material includes a material composition that is different than a material composition of the insulative structures 130 of the tiers 120, including the upper insulative structure 155, and different than a material composition of each of the second insulative material 184 and the third insulative material 186, so that the barrier material 180 is selectively removable relative to the insulative structures 130, the second insulative material 184, and the third insulative material 186.

The first insulative material 170 and the fourth insulative material 188 may individually be formed of and include at least one dielectric material. In some embodiments, one or more of the first insulative material 170 and the fourth insulative material 188 is formed of and includes $SiO_2$. In other embodiments, one or more of the first insulative material 170 and the fourth insulative material 188 is formed of and includes a low-k dielectric material. A material composition of the fourth insulative material 188 may be selected to facilitate substantially complete filling of the recessed regions 190 adjacent to the opening 165, and a material composition of the first insulative material 170 may be selected to facilitate substantially complete filling of the opening 165. In some embodiments, one or more of the first insulative material 170 and the fourth insulative material 188 is a high quality silicon oxide material. For example, the fourth insulative material 188 and/or the first insulative material 170 may be a highly uniform and highly conformal silicon oxide ($SiO_x$) material (e.g., a highly uniform and highly conformal $SiO_2$ material). One or more of the first insulative material 170 and the fourth insulative material 188 may be highly uniform and highly conformal as deposited, such as by ALD. A material composition of the first insulative material 170 may be substantially the same as or different than a material composition of the fourth insulative material 188 and/or the insulative structures 130 of the tiers 120. In embodiments in which the insulative structures 130, the first insulative material 170, and the fourth insulative material 188 (and therefore the insulative extensions 192) are formed of and include the same material, the insulative structures 130, the first insulative material 170, and the insulative extensions 192 may not be visually distinguishable in the electronic device 100. Further, a material composition of each of the first insulative material 170 and the fourth insulative material 188 may be different than a material composition of the barrier material 180.

A lower portion of the first insulative material 170 in the opening 165 directly contacts an upper surface of one of the insulative structures 130 (e.g., the uppermost insulative structures 130 within the lower tier portion 120B of the tiers 120). The fourth insulative material 188 within the recessed regions 190 directly contacts the first insulative material 170 in the opening 165 and directly contacts (e.g., abuts directly against) a lateral side surface of a conductive material of the conductive structures 125 within the upper tier portion 120A of the tiers 120. Upper and lower surfaces of the fourth insulative material 188 directly contact vertically neighboring portions of the insulative structures 130. The first insulative material 170, in combination with the fourth insulative material 188, therefore, separate the conductive structures 125 into two portions.

As most clearly illustrated in FIG. 1B, the pillars 105 (underlying the contact plugs 160) within neighboring subblocks (e.g., the first subblock 166, the second subblock 168) are separated by the first insulative material 170, which extends substantially continuously in the Y-direction between adjacent pillars 105. The first insulative material 170 is, therefore, configured as a substantially continuous (e.g., not segmented) material extending between the first subblock 166 and the second subblock 168 of the stack structure 110. The first insulative material 170, in combination with the fourth insulative material 188 (not shown in the perspective of FIG. 1), functions to electrically isolate the first subblock 166 from the second subblock 168. Further, since the insulative extensions 192 are laterally adjacent to the first insulative material 170 in the upper tier portion 120A, the insulative extensions 192 function to further electrically isolate the conductive structures 125 from one another and from the contact structures 195 to substantially reduce (e.g., substantially prevent) physical and/or electrical connection between the neighboring portions of the conductive structures 125.

As shown in FIG. 1A, the electronic device 100 also includes the source structure 135 adjacent to (e.g., vertically adjacent to, on) the base structure 115. The source structure 135 may be formed of one or more of the electrically conductive materials previously discussed. In some embodiments, the source structure 135 is formed of doped polysilicon. In other embodiments, the source structure 135 is formed of tungsten silicide. The source structure 135 is operably coupled to memory pillars but is isolated from dummy pillars of the pillars 105. The channel material of memory pillars of the pillars 105 is in electrical contact with the source structure 135.

The electronic device 100 according to embodiments of the disclosure includes multiple memory cells. Intersections between the conductive structures 125 of the tiers 120 and the channel material of memory pillars of the pillars 105 define each memory cell and the pillars 105 comprise strings of memory cells. The electronic device 100 may, for example, be a memory device that includes multiple memory planes, each of which may include memory blocks. As shown in FIGS. 1A and 1, the electronic device 100 includes eight pillars 105. The pillars 105 are arranged in a block (e.g., a memory block) that includes multiple subblocks 166, 168 (e.g., memory subblocks). However, more pillars 105 or less pillars 105 may by present in the subblocks and other configurations of pillars 105 are contemplated in the subblocks. The electronic device 100 of FIGS. 1A and 1B includes four pillars within each of the first subblock 166 and the second subblock 168. The opening 165 containing the first insulative material 170 forms two subblocks separated from one another, with each subblock containing the four pillars 105. By separating the two subblocks from one another with the first insulative material 170, each subblock may be separately controlled. The first insulative material 170, in combination with the fourth insulative material 188, provides for electrical isolation of the conductive structures 125 from one another and from the contact structures 195. The electronic device 100 according to embodiments of the disclosure may include, but is not limited to, a 3D electronic device, such as a 3D NAND Flash memory device, (e.g., a multideck 3D NAND Flash memory device). However, the electronic device 100 according to embodiments of the disclosure may be used in other memory devices having multiple decks and in which electrical isolation between adjacent subblocks is desired.

Accordingly, an electronic device is disclosed and comprises a stack structure comprising vertically alternating insulative structures and conductive structures arranged in tiers, pillars extending vertically through the stack structure, and a barrier material overlying the stack structure. The electronic device comprises a first insulative material extending through the barrier material and into an upper tier portion of the stack structure, and a second insulative material laterally adjacent to the first insulative material and laterally adjacent to at least some of the conductive structures in the upper tier portion of the stack structure. At least a portion of the second insulative material is in vertical alignment with the barrier material.

Accordingly, another electronic device is disclosed and comprises pillars arranged in subblocks of a stack structure, and tiers comprising conductive structures separated by insulative structures within the stack structure. At least some of the conductive structures in an upper tier portion of the stack structure are laterally adjacent to an additional insulative material proximate a perimeter of an individual subblock of the stack structure. An outer diameter of a portion of the additional insulative material at an elevation of an uppermost one of the conductive structures in the upper tier portion of the stack structure is greater than an outer diameter of another portion of the additional insulative material at an elevation of a lowermost one of the conductive structures in the upper tier portion of the stack structure.

Figure 1C:
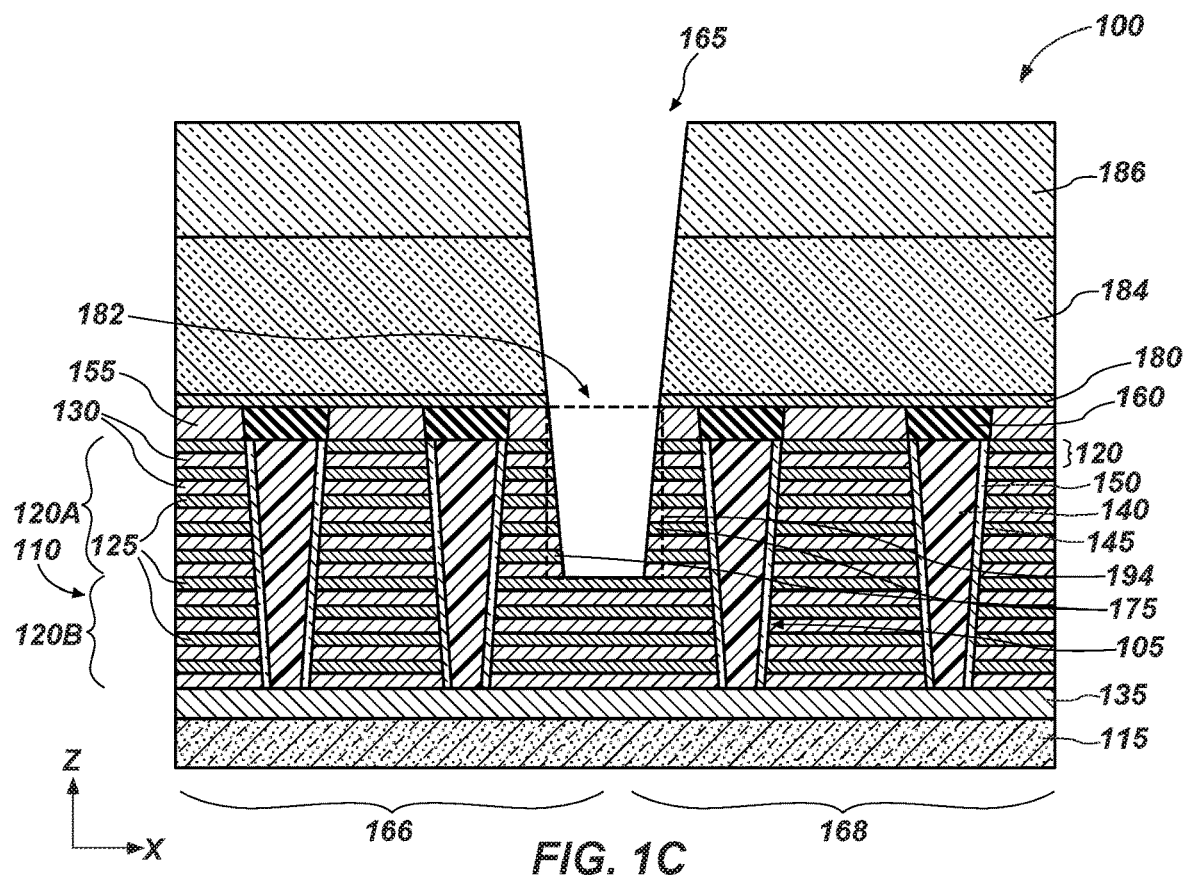
FIGS. 1C through 1F are cross-sectional views at various stages of forming the electronic device according to embodiments of the disclosure.

FIGS. 1C through 1F illustrate a method of forming the electronic device 100 of FIGS. 1A and 1B. Referring to FIG. 1C, a partially fabricated electronic device 100 of the disclosure is shown. The alternating conductive structures 125 and the insulative structures 130 of the stack structure 110 may each individually be formed using conventional processes, which are not described in detail herein.

The pillars 105 may be formed in the stack structure 110 using conventional processes (e.g., conventional deposition processes) and conventional processing equipment, which are not described in detail herein. For example, the pillars 105 may be formed in the pillar openings 145 vertically extending through the tiers 120 of the stack structure 110, into which the cell film 150 and the fill material 140 of the pillars 105 are formed. A portion of the fill material 140 and cell film 150 is removed, recessing an upper surface of the fill material 140 and cell film 150 in the pillar openings 145. The conductive material of the contact plugs 160 is formed adjacent (e.g., on or over) the fill material 140 and cell film 150. Excess conductive material of the contact plugs 160 may be removed by conventional techniques such that the upper surface of the contact plugs 160 is substantially coplanar with the upper insulative structure 155 of the stack structure 110. At this processing stage, the contact plugs 160 and the cell films 150 are configured to be electrically connected to the source structure 135 adjacent to the base structure 115.

The barrier material 180 may be formed adjacent (e.g., on or over) exposed upper surfaces of the upper insulative structure 155 and the contact plugs 160. In some embodiments, the barrier material 180 may be in direct physical contact with each of the upper insulative structure 155 of the tiers 120 of the stack structure 110 and the contact plugs 160 of the pillars 105. In other embodiments, the barrier material 180 may be in direct physical contact with additional contact structures (not shown) and additional insulative structures 130 overlying the upper insulative structure 155 and the contact plugs 160. The barrier material 180 may be formed on or over portions of the exposed upper surfaces of the upper insulative structure 155 and the contact plugs 160 using one or more conventional deposition processes (e.g., a conventional CVD or PVD process).

The second insulative material 184 may be formed adjacent (e.g., on or over) the barrier material 180, and the third insulative material 186 may be formed adjacent (e.g., on or over) the second insulative material 184. For example, second insulative material 184 and the third insulative material 186 may be formed on or over exposed portions of the barrier material 180 and the second insulative material 184, respectively, using one or more conventional deposition processes (e.g., a conventional CVD or PVD process). Each of the barrier material 180, the second insulative material 184, and the third insulative material 186 may individually be formed of and include at least one dielectric material including, but not limited to, an oxide, a nitride, or an oxynitride. By way of non-limiting example, the barrier material 180 may be a nitride material (e.g., a silicon nitride or silicon oxynitride material) and at least one (e.g., both) of the second insulative material 184 and the third insulative material 186 may be an oxide material (e.g., a silicon oxide material). In other words, the material of the barrier material 180 may be formed of a different material having a different etch selectivity than that of each of the second insulative material 184 and the third insulative material 186. Further, the third insulative material 186 may be formed of the same material as or formed of a different material from the second insulative material 184.

As shown in FIG. 1C, the opening 165 is formed and extends through each of the third insulative material 186, the second insulative material 184 and the barrier material 180, and into the upper tier portion 120A of the tiers 120 of the stack structure 110. The opening 165 is formed to extend partially through the stack structure 110 to the lower tier portion 120B without extending therethrough. The opening 165 may extend to an upper portion of the lower tier portion 120B. By way of example only, the opening 165 extends into the upper tier portion 120A a depth of from about one of the tiers 120 to about nine tiers 120 of the upper tier portion 120A. In some embodiments the opening 165 extends into about five tiers 120 of the upper tier portion 120A. The opening 165 runs in a direction (the Y-direction) substantially parallel to an opening (e.g., a slit) (not shown) through which the replacement gate process is conducted. The opening 165 may be formed using conventional processes, such as conventional photolithography processes and conventional material removal processes (e.g., etching processes, such as dry etching and/or wet etching), and conventional processing equipment, which are not described in detail herein. In some embodiments, portions of the third insulative material 186 and the second insulative material 184 may be removed by a first etch act to form the opening 165, and an underlying portion of the barrier material 180 may be removed by a second etch act to form the opening 182 thereof corresponding to the opening 165.

Sidewalls of an upper portion of the opening 165 are defined by remaining portions of the third insulative material 186, the second insulative material 184, and the barrier material 180. Sidewalls of a lower portion of the opening 165 are defined by remaining portions of the conductive structures 125 and the insulative structures 130, including the upper insulative structure 155. As shown in FIG. 1C, the opening 165 may exhibit a U-shape or a V-shape in cross-section, with sidewalls thereof defined by the remaining portions of the third insulative material 186, the second insulative material 184, and the barrier material 180, as well as by the remaining portions of the conductive structures 125 and the insulative structures 130 of the tiers 120 of the stack structure 110. The opening 165 may divide the stack structure 110 of the electronic device 100 into separate subblocks (e.g., the first subblock 166, the second subblock 168). For clarity and convenience, only a single (e.g., one) opening 165 is illustrated, although it is understood that additional openings 165 may be included in other blocks of the stack structure 110 of the electronic device 100 to separate additional subblocks from one another.

The sidewalls of at least the lower portion of the opening 165 defined by the conductive structures 125 and the insulative structures 130 may be sloped (e.g., tapered) with a portion of the opening 165 laterally adjacent to the barrier material 180 (e.g., at the opening 182 thereof) having a greater lateral extent (e.g., width) than a lowermost portion of the opening 165 within the stack structure 110. A region 194 (e.g., a so-called "shadow region"), as shown in dashed lines in FIG. 1C for clarity, may be defined on an upper boundary by a major plane of the barrier material 180 at the opening 182 thereof, by a lower boundary coincident with the lowermost surface of the opening 165 and by opposing side boundaries extending into the underlying stack structure 110 in a vertical direction (e.g., in the Z-direction) substantially orthogonal to a major plane of the barrier material 180. In other words, the region 194 may exhibit a substantially orthogonal (e.g., substantially rectangular) profile originating at the opening 182 of the barrier material 180 and extending down into the stack structure 110 and terminating with the termination of the opening 165 (e.g., at the lowermost boundary of the upper tier portion 120A of the tiers 120).

Portions of the conductive structures 125 of the upper tier portion 120A extending within the region 194 may be referred to herein as sacrificial portions 175 of the conductive structures 125. In some embodiments, additional portions of the conductive structures 125 of the upper tier portion 120A proximate (e.g., immediately adjacent) to the region 194 may also be referred to as the sacrificial portions 175. In other words, portions of the conductive structures 125 within and proximate to the region 194 may be designated for removal during subsequent process acts. In some embodiments, a lateral extent of individual sacrificial portions 175 may be substantially equal to one another. Since the sidewalls of the lower portion of the opening 165 defined by the conductive structures 125 and the insulative structures 130 may be sloped, the sacrificial portions 175 of uppermost portions of the conductive structures 125 may extend to a greater lateral extent (e.g., beyond the profile of the region 194) compared to a lateral extent of the sacrificial portions 175 within lowermost portions of the conductive structures 125 within the upper tier portion 120A, as described in greater detail with reference to FIG. 1E.

Figure 1D:
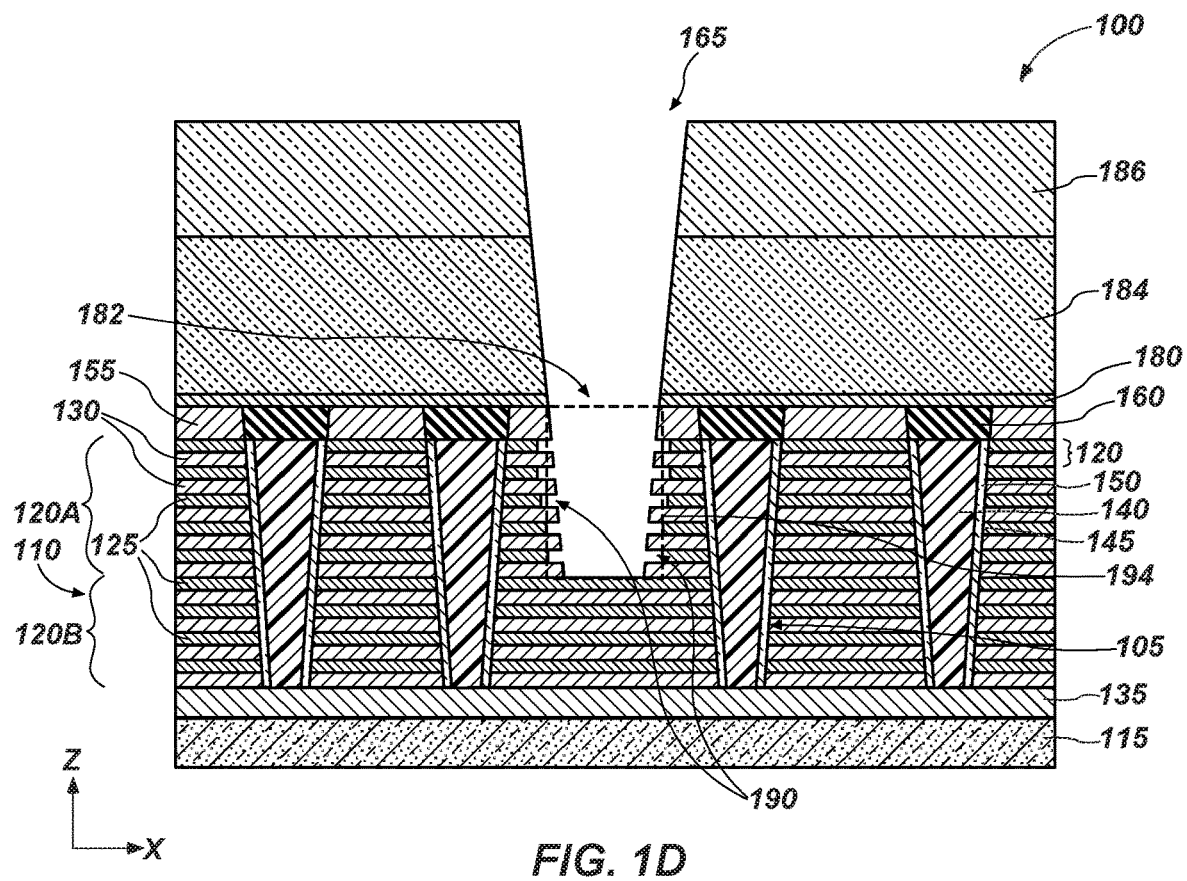

With reference to FIG. 1D, the conductive structures 125 within the upper tier portion 120A of the tiers 120 may be recessed. Recessing the conductive structures 125 increases the width of the opening 165 in the upper tier portion 120A, forming the recessed regions 190 adjacent to the conductive structures 125 of the upper tier portion 120A. For example, the sacrificial portions 175 (FIG. 1C) of the conductive structures within and proximate to the region 194 may be selectively removed relative to the insulative structures 130, to recess the conductive structures 125 a lateral distance. Since the sidewalls of the lower portion of the opening 165 defined by the conductive structures 125 and the insulative structures 130 may be sloped, the recessed regions 190 within uppermost portions of the conductive structures 125 may extend to a greater lateral extent (e.g., beyond the profile of the region 194) compared to a lateral extent of the recessed regions 190 within lowermost portions of the conductive structures 125 within the upper tier portion 120A. In other words, each of the recessed regions 190 may extend from the opening 165 by a substantially equal distance, which results in the uppermost portions of the recessed regions 190 having an outer diameter that is greater than an outer diameter than the recessed regions 190 within the lowermost portions of the conductive structures 125 within the upper tier portion 120A. Accordingly, the insulative structures 130 and the conductive structures 125 widen with increasing depth, from the top of the stack structure 110. In other words, the width of the insulative structures 130 and the remaining portions of the conductive structures 125 laterally adjacent to the recessed regions 190 decrease in width with increasing elevation relative to the base structure 115.

In some embodiments, the sacrificial portions 175 (FIG. 1C) of the conductive structures 125 are removed by exposing the conductive structures 125 to one or more etchants, such as wet etchants, through the opening 165. The wet etchants may include one or more of phosphoric acid, acetic acid, nitric acid, hydrochloric acid, aqua regia, or hydrogen peroxide. In some embodiments, the sacrificial portions 175 may be removed by a phosphoric acid/acetic acid/nitric acid (PAN) etch chemistry. However, the disclosure is not so limited and the sacrificial portions 175 of the conductive structures 125 may be removed with other etchants and/or material removal processes (e.g., vapor phase removal processes, atomic layer removal processes). Forming the recessed regions 190 shortens portions of the conductive structures 125 in the upper tier portion 120A, such that the conductive structures 125 within the upper tier portion 120A and between the opening 165 and one of the pillars 105 immediately adjacent to the opening 165 are shorter (e.g., relatively less wide) than the conductive structures 125 of the lower tier portion 120B.

Figure 1E:
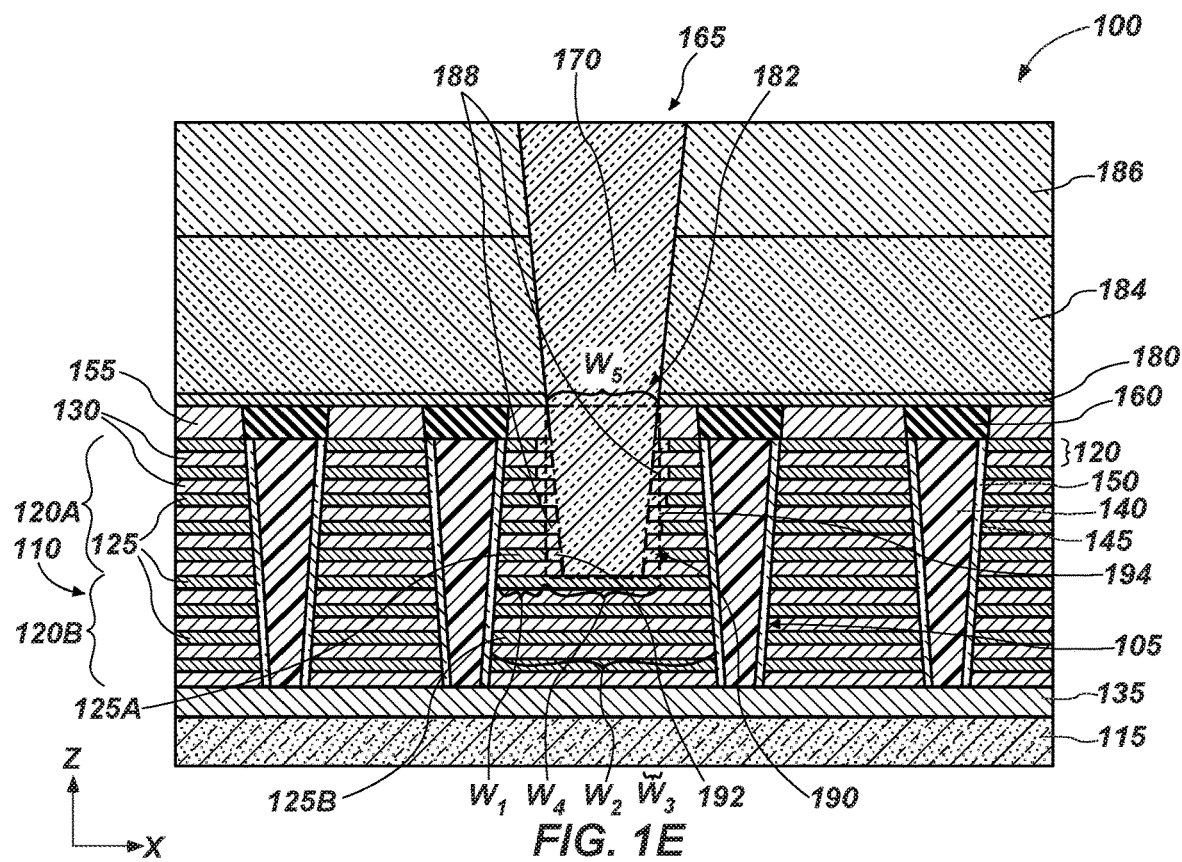

With reference to FIG. 1E, the fourth insulative material 188 may then be formed (e.g., deposited) to fill (e.g., substantially fill) the recessed regions 190, forming the insulative extensions 192 adjacent to the conductive structures 125 in the upper tier portion 120A of the tiers 120, and the first insulative material 170 may be formed (e.g., deposited) to fill (e.g., substantially fill) the opening 165. The insulative extensions 192 are in direct vertical alignment with at least a portion of a neighboring one of the insulative structures 130 in the upper tier portion 120A. In other words, the insulative extensions 192 are vertically adjacent to ends of the insulative structures 130 in the tiers 120 in the upper tier portion 120A. Accordingly, portions of the conductive structures 125 within the upper tier portion 120A (e.g., the portions of the conductive structures 125 laterally adjacent to the insulative extensions 192), such as upper conductive structures 125A, are of a shorter width $W_1$ (e.g., a width that is relatively less) than a width $W_2$ of at least some of the conductive structures 125 in the lower tier portion 120B. The width $W_1$ of the remaining portions of the upper conductive structures 125A between the opening 165 and the proximal pillars 105 may be within a range of from about 5 nm to about 50 nm, and the width $W_2$ of the lower conductive structures 125B between two neighboring pillars 105, may be within a range of from about 50 nm to about 200 nm, as non-limiting examples. For example, the width $W_2$ represents a combined width of the first insulative material 170, as well as opposing portions of the recessed regions 190 and the upper conductive structures 125A. In addition, a pitch between horizontally neighboring pillars 105 may be within a range of from about 50 nm to about 200 nm. A width $W_3$ corresponds to a lateral distance that the conductive structures 125 have been recessed relative to the opening-facing sidewall of a neighboring one of the insulative structures 130. By way of non-limiting example, the width $W_3$ of the recessed regions 190 (FIG. 1D) and, thus, the width of the insulative extensions 192 may be within a range of from about 5 nm to about 50 nm. An outer diameter of the insulative extensions 192 on a single tier of the tiers 120 equals twice the lateral distance of one of the insulative extensions 192 plus a width of the first insulative material 170 in the opening 165. Accordingly, in embodiments in which the insulative extensions 192 extend a lateral distance within a range of from about 5 nm to about 50 nm, each of the insulative extensions 192 may have an outer diameter in the range of, for example, between about 10 nm to about 100 nm plus the width of the first insulative material 170, shown as width $W_4$ in FIG. 1E. By way of non-limiting example, a width of the first insulative material 170 may be within a range of from about 5 nm to about 150 nm. Due to tapering of adjacent structures (e.g., the pillars 105, the first insulative material 170 in the opening 165), the "width" of a particular one of the portions of the conductive structures 125 in either of the upper tier portion 120A and the lower tier portion 120B of the tiers 120 may be its width along its uppermost surface, its width along its midline, or its width along its lowermost surface, or an average thereof.

For example, the pillars 105 may taper in transverse cross-sectional width (e.g., outer diameter) through the height of the stack structure 110, from a broadest width at the top of the stack structure 110, to a narrowest width proximate to the base structure 115. Since the sidewalls of the lower portion of the opening 165 defined by the conductive structures 125 and the insulative structures 130 may be sloped, the first insulative material 170 in the opening 165 may also taper in transverse cross-sectional width (e.g., outer diameter) through a portion of the height of the stack structure 110, from the broadest width at the top of the stack structure 110, to the narrowest width immediately above the lower tier portion 120B. Accordingly, the outer diameter of the insulative extensions 192 having the width $W_4$ may also taper in transverse cross-sectional width (e.g., outer diameter) through a portion of the height of the stack structure, from broadest width at the top of the stack structure 110, to narrowest width immediately above the lower tier portion 120B. The width $W_4$ of the outer diameter of the insulative extensions 192 may be greater than or substantially equal to a width $W_5$ of the opening 182 proximal the barrier material 180 adjacent to the top of the stack structure 110, such that at least a portion of the fourth insulative material 188 of the insulative extensions 192 is below (e.g., in direct vertical alignment with) at least a portion (e.g., a lip, a protrusion) of the barrier material 180 overlying the stack structure 110. In other words, the insulative extensions 192 may extend to, and in some instances, beyond a perimeter of the region 194 on opposing sides of the first insulative material 170. By way of non-limiting example, the width $W_4$ of the outer diameter of the insulative extensions 192 may be within a range of from about 10 nm to about 300 nm, and the width $W_5$ of the opening 182 of the barrier material 180 may be within a range of from about 10 nm to about 200 nm.

In some embodiments, at least some (e.g., each) of the conductive structures 125 in the upper tier portion 120A of the tiers 120 are laterally (e.g., horizontally) recessed relative to vertically neighboring portions of the insulative structures 130. Furthermore, the conductive structures 125 in the upper tier portion 120A are laterally recessed relative to the barrier material 180 overlying the stack structure 110. For example, portions of the insulative extensions 192 proximal to the first insulative material 170 are in vertical alignment with the opening 182 of the barrier material 180 and other portions of the insulative extensions 192 distal from the first insulative material 170 are in vertical alignment with the barrier material 180, without being in vertical alignment with the opening 182 thereof. Accordingly, at least portions of the insulative extensions 192 extend vertically below the barrier material 180. Further, the insulative extensions 192 are laterally adjacent (e.g., in direct horizontal alignment) with at least some of the conductive structures 125. For example, the insulative extensions 192 may be laterally adjacent to (e.g., directly between) at least some of the upper select gates (e.g., SGDs) and the first insulative material 170 in the opening 165 (e.g., an SGD isolation slit).

With continued reference to FIG. 1E, the fourth insulative material 188 may be formed in the recessed regions 190, substantially completely filling the recessed regions 190 to form the insulative extensions 192, and the first insulative material 170 may be formed in the opening 165, substantially completely filling the opening 165. The fourth insulative material 188 and the first insulative material 170 may individually be formed in the recessed regions 190 and the opening 165 by conventional techniques (e.g., a PVD process, a CVD process, ALD process, a spin-coating process). In some embodiments, at least one (e.g., both) of the fourth insulative material 188 and the first insulative material 170 is a highly conformal ALD oxide, such as an ALD $SiO_x$. Excess first insulative material 170 may be removed by conventional techniques, such as by chemical-mechanical planarization, such that the upper surface of the first insulative material 170 in the opening 165 is substantially coplanar with the upper surface of the third insulative material 186. In some embodiments, the opening 165 exhibits a U-shape or V-shape in cross-section, with the sidewalls initially defined by the sloped surfaces of the conductive structures 125 and the insulative structures 130. However, the opening 165 may be defined by substantially vertical sidewalls of the conductive structures 125 and the insulative structures 130 within the upper tier portion 120A so long as the first insulative material 170 may be formed therein without forming voids in the fourth insulative material 188 and/or the first insulative material 170 (e.g., along a boundary therebetween).

In some embodiments, the fourth insulative material 188 is formed prior to formation of the first insulative material 170. For example, the fourth insulative material 188 is conformally formed within the recessed regions 190 to form the insulative extensions 192 laterally adjacent to the remaining portions of the conductive structures 125. Thereafter, the first insulative material 170 may be formed in the opening 165. In other embodiments, the first insulative material 170 is formed during formation of the fourth insulative material 188 of the insulative extensions 192. For example, the first insulative material 170 and the fourth insulative material 188 may be formed substantially simultaneously in order to simplify manufacturing processes. In other words, the fourth insulative material 188 and the first insulative material 170 may be deposited to substantially fill the recessed regions 190 as well as the opening 165 in a single deposition act. In some such embodiments, an interface between the fourth insulative material 188 and the first insulative material 170 may not be visible.

In additional embodiments, more than two (e.g., three or more) deposition acts may be used during formation of the fourth insulative material 188 and the first insulative material 170. For example, the fourth insulative material 188 may initially be formed within the recessed regions 190 followed by formation of the first insulative material 170 within the lower portion of the opening 165 laterally adjacent to the upper tier portion 120A. Thereafter, another portion of the first insulative material 170 may be formed in the upper portion of the opening 165 laterally adjacent to the third insulative material 186, the second insulative material 184, and the barrier material 180. However, the disclosure is not so limited, and additional deposition acts may be contemplated. For example, differing portions (e.g., differing elevational levels) of the fourth insulative material 188 and/or the first insulative material 170 may be formed in multiple deposition acts to form the insulative extensions 192 laterally separated by the first insulative material 170.

Figure 1F:
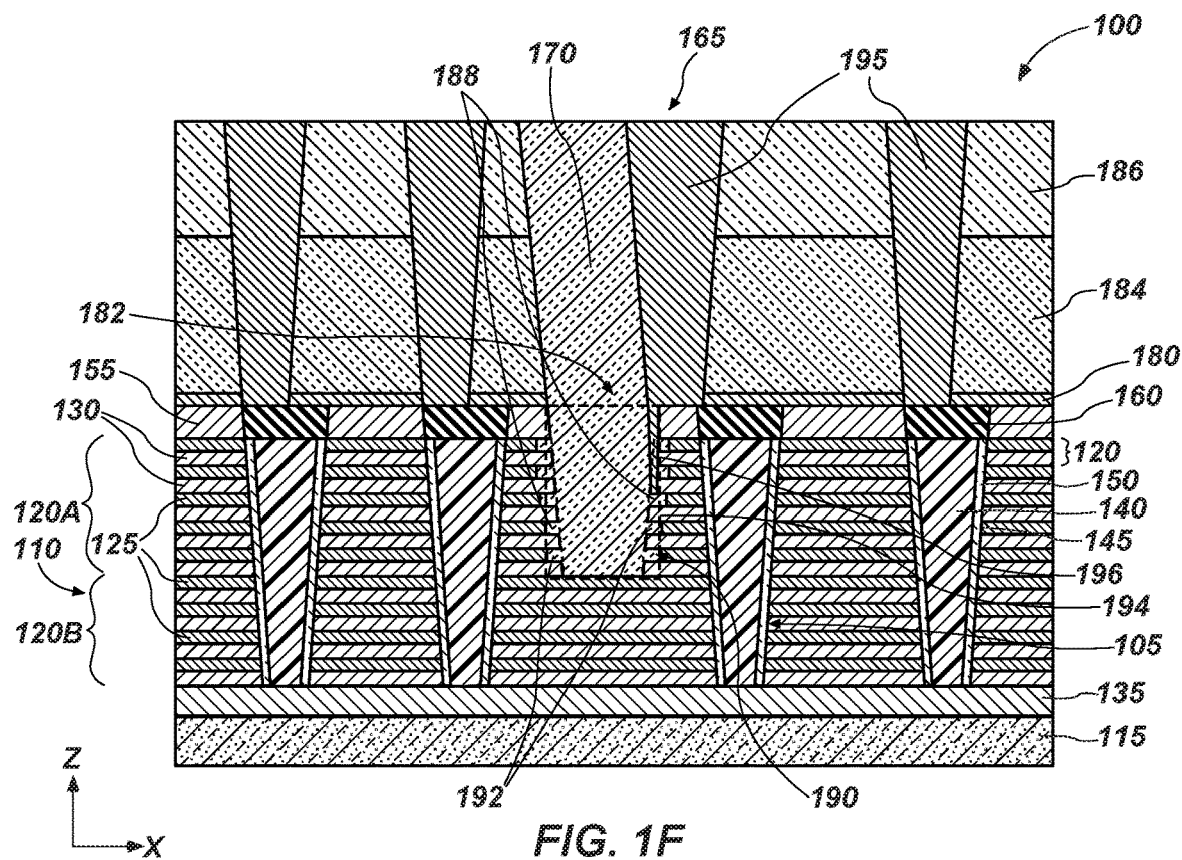

With reference to FIG. 1F, the contact structures 195 are formed in additional openings (not shown) extending through each of the third insulative material 186, the second insulative material 184 and the barrier material 180. The additional openings may be formed by conventional techniques. For example, additional portions of the third insulative material 186 and the second insulative material 184 may be removed by a first etch act and an underlying portion of the barrier material 180 may be removed by a second etch act to form the additional openings and to expose upper surfaces of the contact plugs 160 of the pillars 105. However, the disclosure is not so limited and the additional openings may be formed using a single material removal act. The contact structures 195 may be formed within the additional openings using one or more conventional processes (e.g., conventional deposition processes, conventional material removal processes) and conventional processing equipment, which are not described in detail herein. The contact structures 195 may be formed between the contact plugs 160 and other conductive elements formed over the contact structures 195. In some embodiments, the contact structures 195 are formed immediately adjacent to (e.g., directly on) the contact plugs 160. In other embodiments, additional contact structures (not shown) may be formed between the contact structures 195 and the contact plugs 160.

The contact structures 195 may be configured to be positioned over (e.g., in direct vertical alignment with) the contact plugs 160 of the pillars 105 such that at least a portion of the outer side surfaces of the contact structures 195 and the contact plugs 160 are substantially aligned with one another, as shown in FIG. 1F. In other words, the outer side surfaces of at least some of the contact structures 195 and the contact plugs 160 may be substantially flush with one another along at least one side thereof. As discussed above, the contact structures 195 may be laterally offset (e.g., positioned off-center or staggered) in order to facilitate electrical connection with the contact plugs 160.

However, even if the contact structures 195 are misaligned, the electronic devices 100 according to embodiments of the disclosure are not susceptible to bridging (e.g., shorting, electrical connection) between neighboring portions of the conductive structures 125 due to the presence of the insulative extensions 192. During occurrences of misalignment, one or more of the contact structures 195 may not be in direct vertical alignment with the underlying contact plugs 160 of the pillars 105. For example, and as shown by the third contact structure 195 from the left in FIG. 1F, the contact structures 195 may overlap at least a portion of the first insulative material 170 during formation of the contact structures 195. The third contact structure 195 from the left in FIG. 1F illustrates a contact structure 195 that is greatly misaligned with the cell films 150 and the contact plugs 160 of the underlying pillars 105. However, the embodiments of the disclosure may also be used with electronic devices 100 having contact structures 195 that exhibit a lower extent of misalignment. In the embodiment of FIG. 1F, the insulative extensions 192 between the first insulative material 170 and the conductive structures 125 may substantially reduce (e.g., substantially prevent, substantially eliminate) physical and/or electrical connection between the contact structures 195 and the neighboring portions of the conductive structures 125 within specified regions (e.g., within and proximate to the region 194). The insulative extensions 192 may separate (e.g., electrically isolate) a residual portion 196 of the third contact structure 195 from the left from at least some of the conductive structures 125 within the upper tier portion 120A by forming the insulative extensions 192 between the first insulative material 170 and the conductive structures 125 of the upper tier portion 120A, as shown in FIG. 1F.

For example, the presence of the insulative extensions 192 (e.g., an additional region of insulative material) laterally adjacent to the conductive structures 125 may substantially reduce (e.g., substantially prevent) occurrences of bridging (e.g., electrical connection) between two or more portions of the conductive structures 125 in the event that the residual portion 196 of the contact structures 195 extends below the barrier material 180. Stated another way, the insulative extensions 192 may substantially reduce (e.g., substantially sever) electrical connection between neighboring portions of the conductive structures 125 when contact structures 195 (e.g., misaligned contact structures 195) overlap the first insulative material 170 in the opening 165 (e.g., within the so-called "shadow region" of the region 194) below the barrier material 180. Thus, the contact structures 195 may be formed above respective contact plugs 160 of the pillars 105 without providing electrical connection between neighboring portions of the conductive structures 125 through the residual portion 196 of the contact structures 195. Accordingly, the first insulative material 170 is surrounded by the barrier material 180, the second insulative material 184, and the third insulative material 186 above the stack structure 110, and the first insulative material 170 is surrounded by the insulative extensions 192 and the insulative structures 130, including the upper insulative structure 155, within the tiers 120. In other words, the first insulative material 170 directly contacts the fourth insulative material 188 of the insulative extensions 192 without directly contacting the conductive structures 125 within the upper tier portion 120A.

The first insulative material 170 is present in a central region of an individual block of the electronic device 100 and functions to electrically isolate one subblock (e.g., memory subblock) of the electronic device 100 from another (e.g., an adjacent) subblock of the electronic device 100. The presence of the fourth insulative material 188 in the recessed regions 190 laterally adjacent to the first insulative material 170 and laterally adjacent to the conductive structures 125 changes the configuration of the stack structure 110 of the electronic device 100 since the fourth insulative material 188 of the insulative extensions 192, in combination with the first insulative material 170, electrically isolates the neighboring portions of the conductive structures 125 when misaligned contact structures 195 overlap the first insulative material 170 in the opening 165. Therefore, the neighboring portions of the conductive structures 125 are further physically and/or electrically isolated from one another by the insulative extensions 192.

Figure 1G:
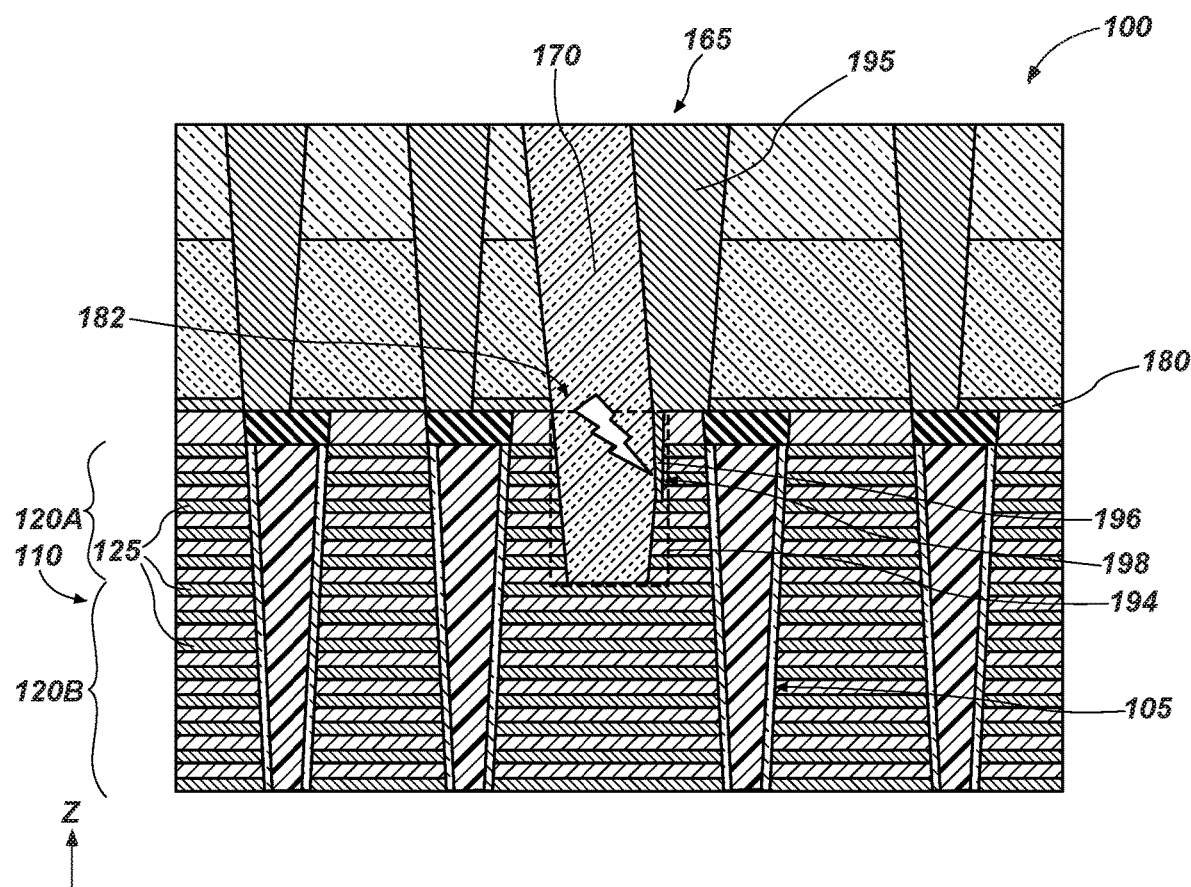
FIG. 1G is a cross-sectional view of a conventional electronic device at a similar processing stage as that of FIG. 1F.

In contrast, a portion of the conductive structures 125 in conventional electronic devices are exposed below the opening 182 of the barrier material 180 (e.g., within the region 194) during a corresponding stage of the fabrication process and may be susceptible to electrical contact (e.g., bridging) with the residual portion 196 of the contact structures 195 during subsequent process acts. As shown in FIG. 1G, which is a cross-sectional view of a conventional electronic device 10 at a similar stage of fabrication as FIG. 1F, insulative structures similar to the insulative extensions 192 (FIG. 1F) according to embodiments of the disclosure are not present between the first insulative material 170 in the opening 165 and the conductive structures 125. Rather, the stack structure 110 of the conventional electronic device 10 is separated (e.g., segmented) into subblocks by the first insulative material 170 without forming recessed regions 190 (FIG. 1F) of the conductive structures 125 and without forming the insulative extensions 192 (FIG. 1F) in such recessed regions.

For example, and in the conventional electronic devices, contact (e.g., physical contact, electrical contact) between the residual portion 196 of the contact structures 195 and the conductive structures 125 may result in a point of contact 198 therebetween, compared to formation of the insulative extensions 192 (FIG. 1F) between the first insulative material 170 and the conductive structures 125 of the upper tier portion 120A. In conventional electronic devices, the SGD isolation openings (e.g., the opening 165) may be formed following formation of the alternating tiers of the insulative structures 130 and the conductive structures 125 (e.g., after a replacement gate process). Since the first insulative material 170 of conventional electronic devices is formed within the opening 165 prior to formation of the contact structures 195, at least a portion (e.g., the residual portion 196) of conductive material of a misaligned contact structure 195 may extend through the opening 182 of the barrier material 180 and contact exposed portions of the conductive structures 125 within or proximate to the region 194 during formation of the contact structures 195. In other words, if underlying materials (e.g., oxide materials) within the stack structure 110 are not of sufficient material composition to provide a barrier against formation of the residual portion 196 of the contact structures 195 below the barrier material 180, then bridging may occur between the residual portion 196 of the contact structures 195 and at least some of the conductive structures 125 in the upper tier portion 120A, resulting in unintended connection between neighboring conductive structures 125, which may short a subsequently formed electronic device during use and operation.

Accordingly, exposure of the conductive structures 125 within or proximate to the region 194 in the conventional electronic device 10 may lead to bridging and/or increased contact resistance of the conventional electronic device. Furthermore, the first insulative material 170 may exhibit an increased width in conventional devices in order to provide sufficient isolation between neighboring contact plugs 160 and neighboring pillars 105 in the upper tier portion 120A, which may result in requirements for increased area (e.g., increased etch profile requirements for an SGD isolation etch) within a stack structure of the conventional electronic device.

The methods of the disclosure, substantially reduce the occurrence of such unintended connections between neighboring conductive structures 125 due to the presence of the insulative extensions 192 between the first insulative material 170 and the conductive structures 125 in the upper tier portion 120A. Formation of the insulative extensions 192 according to embodiments of the disclosure may facilitate a reduction in etch profile requirements for the upper select gate isolation provided by the first insulative material 170 and may also facilitate reduced contact resistance within the upper tier portion 120A during use and operation. In addition, by laterally recessing the conductive structures 125 and forming the insulative extensions 192, a distance between the conductive structures 125 may be increased relative to a corresponding distance between the conductive structures 125 of the conventional electronic device 10. The increased distance between the conductive structures 125 according to embodiments of the disclosure may facilitate circuitry to operate at substantially increased voltages, while the risk of breakdown of the insulative materials is substantially decreased without increasing the amount of real estate consumed by the first insulative material 170. Accordingly, formation of the insulative extensions 192 may reduce various processing complexities (e.g., complexities associated with properly sizing and aligning various contact openings and structures) associated with the formation of conventional contact structures and associated insulative materials for an electronic device.

Accordingly, a method of forming an electronic device is disclosed. The method comprises forming a stack structure comprising vertically alternating insulative structures and conductive structures arranged in tiers, forming a barrier material vertically overlying and horizontally extending across the stack structure, and forming at least one opening through the barrier material and into an upper tier portion of the stack structure. The method comprises recessing sacrificial portions of the conductive structures in the upper tier portion adjacent to the at least one opening, and forming an insulative material in recessed regions of the conductive structures and the at least one opening. The recessed regions of the conductive structures are in direct, substantially vertical alignment with the barrier material.

Figure 2:
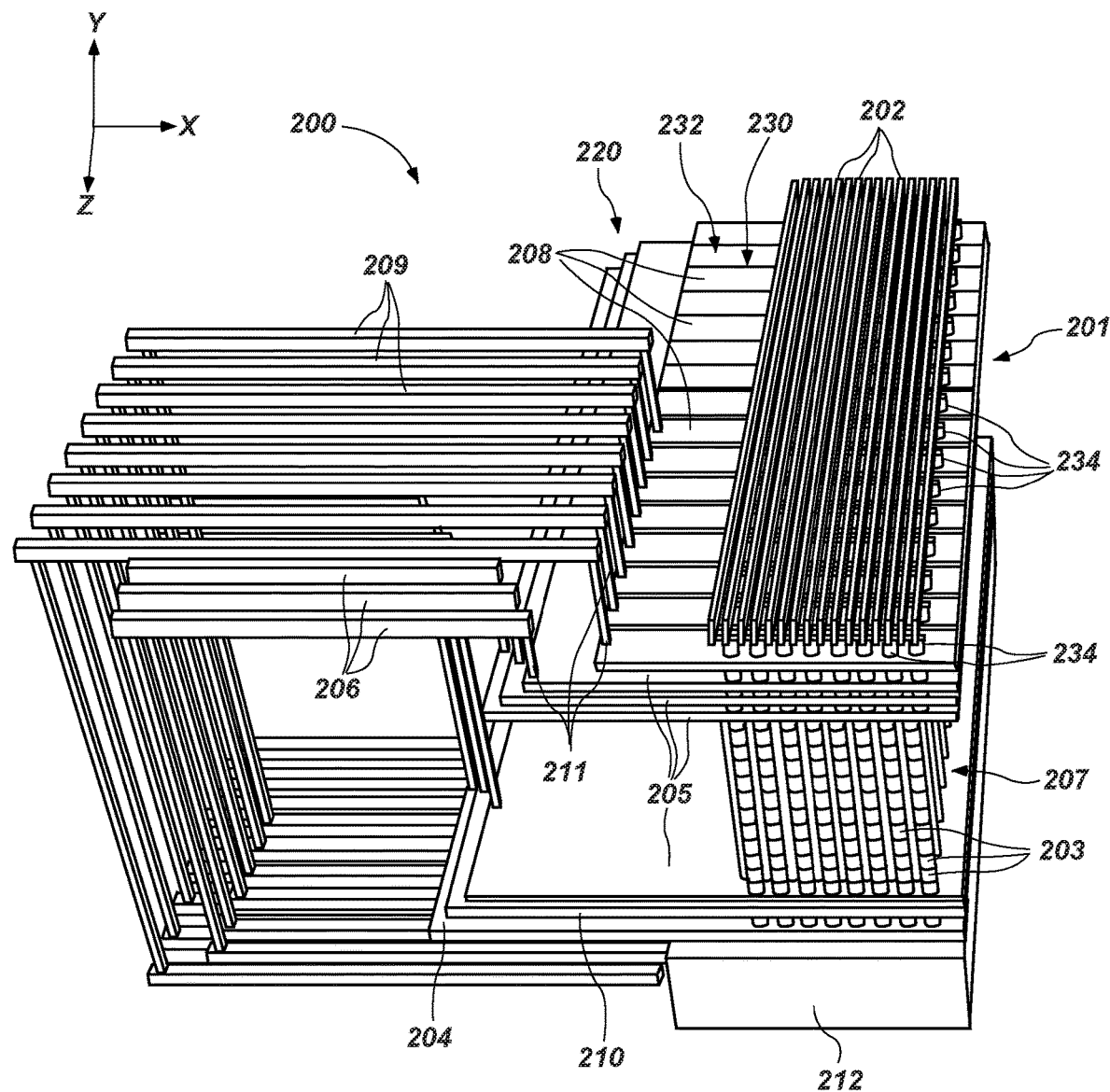
FIG. 2 is a partial cutaway perspective view of an electronic device according to embodiments of the disclosure.

FIG. 2 illustrates a partial cutaway perspective view of a portion of an electronic device 200 (e.g., a microelectronic device, a memory device, such as a 3D NAND Flash memory device) including an electronic device structure 201 (e.g., a microelectronic device structure). The electronic device 200 may be substantially similar to the electronic device 100 previously described with reference to FIGS. 1A through 1F. As shown in FIG. 2, the electronic device structure 201 of the electronic device 200 may include a staircase structure 220 defining contact regions for connecting access lines 206 to conductive structures 205 (e.g., corresponding to the conductive structures 125 (FIG. 1A)). The electronic device structure 201 may include vertical strings 207 of memory cells 203 that are coupled to each other in series. The vertical strings 207 may extend vertically (e.g., in the Z-direction) and orthogonally to conductive lines and the conductive structures 205, such as data lines 202, a source tier 204 (e.g., including the source structure 135 (FIG. 1A)), the access lines 206, first select gates 208 (e.g., upper select gates, drain select gates (SGDs)) corresponding to the upper conductive structures 125A (FIG. 1E), select lines 209 corresponding to the lower conductive structures 125B (FIG. 1E), and a second select gate 210 (e.g., a lower select gate, a source select gate (SGS)). The select gates 208 may be horizontally divided (e.g., in the Y-direction) into multiple blocks 232 horizontally separated (e.g., in the Y-direction) from one another by slots 230.

Vertical conductive contacts 211 may electrically couple components to each other as shown. For example, the select lines 209 may be electrically coupled to the first select gates 208 and the access lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual group of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the access lines 206 and the conductive structures 205 through the vertical conductive contacts 211. In other words, an individual conductive structure 205 may be selected via an access line 206 in electrical communication with a respective vertical conductive contact 211 in electrical communication with the conductive structure 205.

The data lines 202 may be electrically coupled to the vertical strings 207 through conductive contact structures 234 (e.g., the contact structures 195 formed over the pillars 105 (FIG. 1A)).

Figure 3:
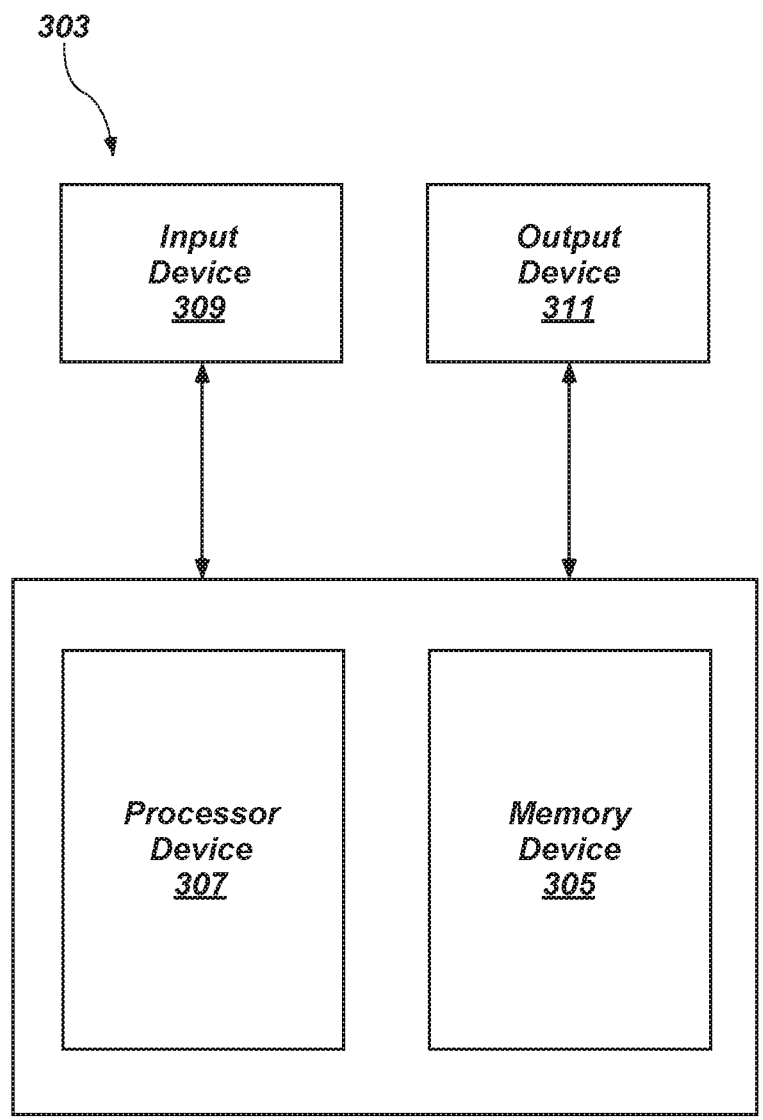
FIG. 3 is a block diagram of an electronic system according to embodiments of the disclosure.

Electronic devices (e.g., the electronic devices 100, 200) and electronic device structures (e.g., the electronic device structure 201) including the insulative extensions 192 laterally adjacent to the first insulative material 170 and the conductive structures 125 in the upper tier portion 120A of the tiers 120, according to embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device previously described herein (e.g., the electronic devices 100, 200), previously described with reference to FIGS. 1A through 1F and FIG. 2, including the insulative extensions 192 laterally adjacent to the first insulative material 170 and the conductive structures 125.

The electronic system 303 may further include at least one electronic signal processor device 307 (often referred to as a "microprocessor"). The electronic signal processor device 307 may, optionally, include an embodiment of an electronic device or an electronic device structure previously described herein (e.g., one or more of the electronic devices 100, 200 or the electronic device structure 201), previously described with reference to FIGS. 1A through 1F and FIG. 2. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
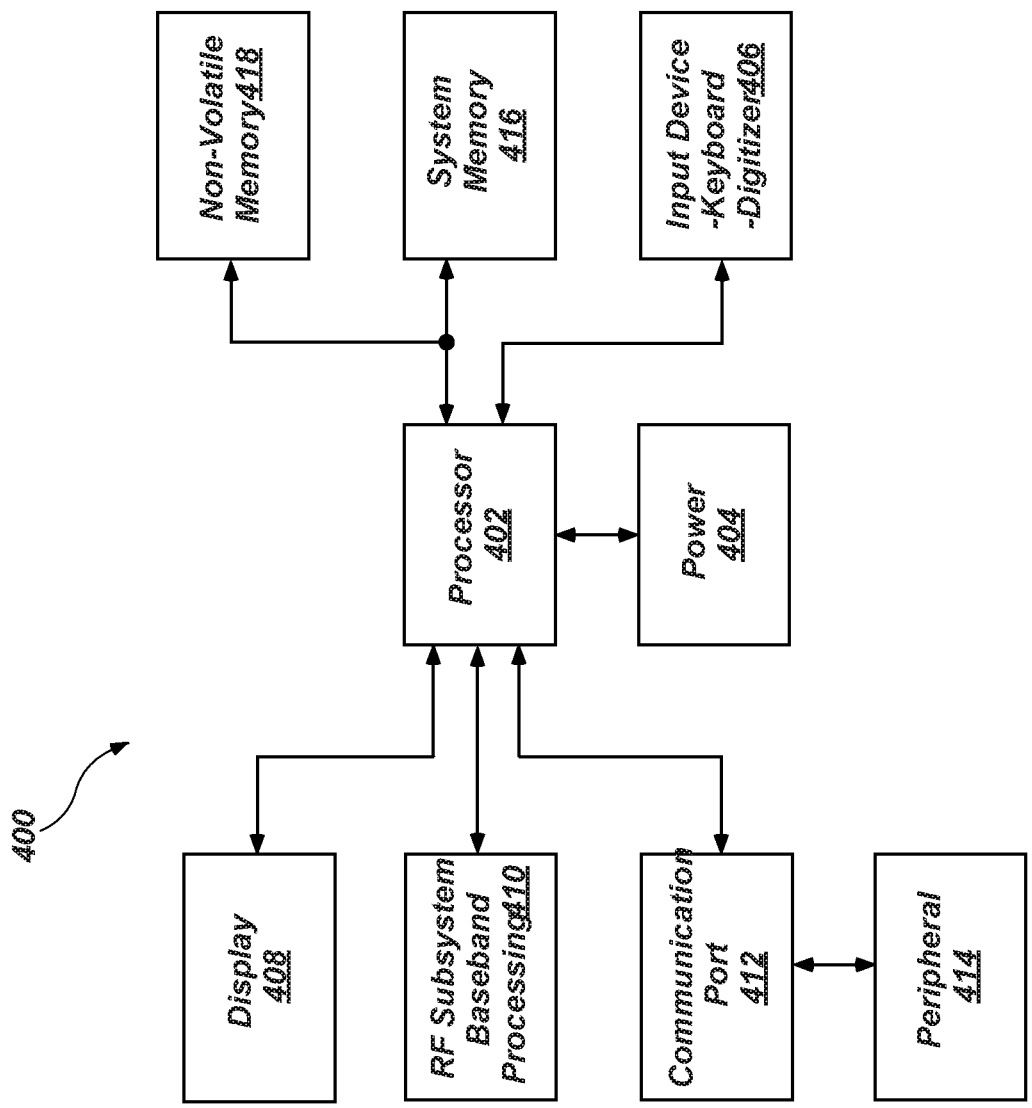
FIG. 4 is a block diagram of a processor-based system according to embodiments of the disclosure.

With reference to FIG. 4, depicted is a processor-based system 400. The processor-based system 400 may include various electronic devices and electronic device structures (e.g., microelectronic devices and microelectronic device structures including one or more of the electronic devices 100, 200 or the electronic device structure 201) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices and electronic device structures (e.g., microelectronic devices and microelectronic device structures including one or more of the electronic devices 100, 200 or the electronic device structure 201) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices and electronic device structures (e.g., the electronic devices 100, 200 or the electronic device structure 201) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices and microelectronic device structures (e.g., electronic devices 100, 200 or the electronic device structure 201) described above, or a combination thereof.

Accordingly, a system comprising an input device, an output device, a processor device operably coupled to the input device and the output device, and a memory device is disclosed. The memory device is operably coupled to the processor device and comprises at least one microelectronic device comprising a stack structure comprising tiers of alternating insulative structures and conductive structures, a central insulative material between subblocks of the stack structure, and insulative extensions extending laterally from the central insulative material. The insulative extensions are laterally adjacent to the conductive structures of upper select gates of the stack structure.

The electronic devices and systems of the disclosure advantageously facilitate one or more of improved simplicity, greater packaging density, and increased miniaturization of components as compared to conventional structures, conventional devices, and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
    a stack structure comprising vertically alternating insulative structures and conductive structures arranged in tiers, the stack structure comprising an upper tier portion and a lower tier portion underlying the upper tier portion, the conductive structures in the upper tier portion of the stack structure recessed relative to the insulative structures and configured as drain side select gates;
    pillars extending vertically through the stack structure;
    a nitride barrier material overlying an uppermost conductive structure of the stack structure;
    a first insulative material separating laterally adjacent subblocks of the stack structure, the first insulative material extending through an entirety of the nitride barrier material and into the upper tier portion of the stack structure; and
    a second insulative material directly laterally on the first insulative material, and the second insulative material directly laterally on at least some of the conductive structures in the upper tier portion of the stack structure with lateral side surfaces of the second insulative material abutting directly against lateral side surfaces of each of the drain side select gates, and upper and lower surfaces of the second insulative material and the drain side select gates coplanar with one another, at least a portion of the second insulative material vertically underlying the nitride barrier material.

2. The electronic device of claim 1, further comprising contact plugs in an upper portion of the pillars and contact structures overlying the contact plugs, wherein the contact structures directly physically contact the contact plugs through openings in the nitride barrier material.

3. The electronic device of claim 2, wherein lateral side surfaces of the contact structures directly contact lateral side surfaces of the nitride barrier material.

4. The electronic device of claim 1, wherein the first insulative material comprises a single, substantially continuous portion of an oxide material extending between the laterally adjacent subblocks of the stack structure.

5. The electronic device of claim 1, wherein the first insulative material tapers in width from a broadest width at a top of the stack structure to a narrowest width at a bottom of the upper tier portion of the stack structure.

6. The electronic device of claim 1, wherein the second insulative material is in direct vertical alignment with at least a portion of a neighboring one of the insulative structures in the upper tier portion of the stack structure.

7. The electronic device of claim 1, wherein the first insulative material is in direct physical contact with and substantially laterally surrounded by the second insulative material and the insulative structures within the tiers.

8. The electronic device of claim 1, wherein a lateral extent of the second insulative material is greater than a lateral extent of a central opening of the nitride barrier material.

9. The electronic device of claim 1, wherein the first insulative material and the second insulative material comprise a continuous portion of an oxide material with no interface therebetween.

10. The electronic device of claim 1, wherein lateral ends of the conductive structures of the stack structure are substantially surrounded on three sides by the first insulative material and the second insulative material.

11. An electronic device, comprising:
    pillars arranged in subblocks of a stack structure, the pillars comprising a channel material and at least one dielectric material;
    tiers comprising conductive structures vertically separated by insulative structures within the stack structure;
    an insulative material between neighboring subblocks of the stack structure; and
    an additional insulative material proximate a perimeter of an individual subblock and directly on lateral sidewalls of the insulative material, at least some of the conductive structures in an upper tier portion of the stack structure configured as drain side select gates and located directly on lateral sidewalls of the additional insulative material with lateral side surfaces of the additional insulative material abutting directly against lateral side surfaces of each of the drain side select gates, and upper and lower surfaces of the additional insulative material and the drain side select gates coplanar with one another, and the additional insulative material laterally separated from the at least one dielectric material of the pillars most proximate thereto by portions of the conductive structures of the tiers laterally intervening therebetween, wherein an outer diameter of a portion of the additional insulative material at a vertical elevation of an uppermost one of the conductive structures in the upper tier portion of the stack structure is greater than an outer diameter of another portion of the additional insulative material at a vertical elevation of a lowermost one of the conductive structures in the upper tier portion of the stack structure.

12. The electronic device of claim 11, wherein the additional insulative material extends laterally to define insulative extensions directly on upper surfaces and lower surfaces of ends of the insulative structures in the tiers in the upper tier portion, the insulative extensions electrically isolating the conductive structures from one another.

13. The electronic device of claim 12, wherein at least some of the conductive structures in the upper tier portion of the stack structure are laterally recessed relative to the insulative structures in the tiers of the stack structure.

14. The electronic device of claim 11, further comprising a barrier material overlying the pillars and an uppermost boundary of the stack structure, the additional insulative material extending away from the perimeter of the individual subblock with at least a portion of the additional insulative material vertically underlying the barrier material.

15. The electronic device of claim 14, wherein the additional insulative material comprises an oxide material and the barrier material comprises a nitride material.

16. The electronic device of claim 11, wherein portions of the conductive structures in the upper tier portion of the stack structure are relatively shorter in a horizontal direction than portions of the conductive structures in a lower tier portion of the stack structure.

\* \* \* \* \*